(12) United States Patent
Gunji et al.

(10) Patent No.: US 7,858,173 B2
(45) Date of Patent: Dec. 28, 2010

(54) THERMOPLASTIC POLYHYDROXY POLYETHER RESIN AND RESIN COMPOSITION COMPRISING THE SAME

(75) Inventors: Masao Gunji, Sodegaura (JP); Chiaki Asano, Tokyo (JP)

(73) Assignee: Nippon Steel Chemicals Co., Ltd., Tokyo (JP)

( * ) Notice: Subject to any disclaimer, the term of this patent is extended or adjusted under 35 U.S.C. 154(b) by 0 days.

(21) Appl. No.: 12/593,345

(22) PCT Filed: Mar. 24, 2008

(86) PCT No.: PCT/JP2008/056250

§ 371 (c)(1),
(2), (4) Date: Sep. 28, 2009

(87) PCT Pub. No.: WO2008/123474

PCT Pub. Date: Oct. 16, 2008

(65) Prior Publication Data

US 2010/0119805 A1    May 13, 2010

(30) Foreign Application Priority Data

Mar. 26, 2007  (JP) ............................. 2007-079348

(51) Int. Cl.
*B32B 27/04* (2006.01)
(52) U.S. Cl. .................. 428/297.4; 528/99; 528/104; 523/451; 525/107; 525/109; 525/423; 428/343; 428/209
(58) Field of Classification Search .............. 428/292.1, 428/297.4, 343, 209; 528/99, 104; 523/451; 525/107, 109, 423, 438, 523, 525
See application file for complete search history.

(56) References Cited

U.S. PATENT DOCUMENTS

| | | | |
|---|---|---|---|
| 5,059,293 A | 10/1991 | Sugishima et al. | |
| 7,397,139 B2 * | 7/2008 | Ikezawa et al. | 257/787 |
| 2009/0014355 A1 * | 1/2009 | Stark et al. | 208/125 |
| 2009/0162650 A1 * | 6/2009 | Hong et al. | 428/354 |
| 2010/0093928 A1 * | 4/2010 | Yokoyama et al. | 524/610 |
| 2010/0119805 A1 * | 5/2010 | Gunji et al. | 428/292.1 |

FOREIGN PATENT DOCUMENTS

| | | |
|---|---|---|
| JP | 62-223215 A | 10/1987 |
| JP | 2-255878 A | 10/1990 |
| JP | 3-275711 A | 12/1991 |
| JP | 5-214070 A | 8/1993 |
| JP | 9-59349 A | 3/1997 |
| JP | 11-269264 A | 10/1999 |
| JP | 2001-310939 A | 11/2001 |
| JP | 2002-249540 A | 9/2002 |
| JP | 2002-265562 A | 9/2002 |
| JP | 2007-177054 A | 7/2007 |

OTHER PUBLICATIONS

International Search Report of PCT/JP2008/056250 (Jun. 13, 2008).

* cited by examiner

*Primary Examiner*—N. Edwards
(74) *Attorney, Agent, or Firm*—Millen, White, Zelano & Branigan, P.C.

(57) ABSTRACT

A novel flame-retardant thermoplastic polyhydroxy polyether resin obtained by reacting at least one epoxy resin (A) selected from glycidyl esters of divalent aliphatic carboxylic acids having 15 to 64 carbon atoms or glycidyl ethers of divalent aliphatic alcohols having 15 to 64 carbon atoms with a phosphorus atom-containing divalent phenol compound (B) as essential components, wherein the component (A) accounts for 2 to 52 mol % with respect to the whole resin, the weight average molecular weight thereof is 10,000 to 200,000, and the phosphorus content thereof is 1 to 5 wt %.

18 Claims, No Drawings

THERMOPLASTIC POLYHYDROXY POLYETHER RESIN AND RESIN COMPOSITION COMPRISING THE SAME

TECHNICAL FIELD

The present invention relates to a thermoplastic polyhydroxy polyether resin which is useful in the electrical and electronic industrial fields of interlayer insulation electrolaminates, magnetic tape binders, insulating varnish, self-fusing enameled wire varnish and the like, is useful for adhesives, insulating coatings, films and the like, exhibits by itself flame retardancy because it comprises phosphorus, exhibits a heat resistance, a low elasticity and a low stress behavior, and is excellent in flexibility, resin compositions comprising the thermoplastic polyhydroxy polyether resin, an epoxy resin, a curing agent, an additive and a filler, and adhesive films and prepregs using them, and further relates to laminates, multilayer printed wiring boards and insulating films using them.

BACKGROUND ART

Thermoplastic polyhydroxy polyether resins have been known as phenoxy resins. As they are excellent in flexibility, impact resistance, adhesiveness, mechanical strength and the like, in the electric and electronic industrial fields, they are applied to a wide range of uses, i.e., magnetic tape binders, insulating varnish for electric machines such as motors and the like, adhesives for circuit boards, films and the like. Among them, in the fields where the safety of electric and electronic products such as prevention and retardation of a fire disaster is strongly demanded, halogenated phenoxy resins, mainly brominated phenoxy resins have been used. However, it has been known that if a material comprising a halogenated substance is used at a high temperature for a long period of time, the halogenated substance is released, which causes corrosion of wires. Further, if waste products of used electric parts and electric equipments are burned, harmful substances such as halogenated substances and the like are produced. Therefore, the direct and indirect use of a halogen has been considered to be a problem in terms of the environmental safety, and materials which can replace the halogenated substances have been studied.

Patent Publication 1 Kokai (Jpn. Unexamined Patent Publication) No. 5-93041

Patent Publication 2 Kokai No. 5-93042
Patent Publication 3 Kokai No. 2001-310939
Patent Publication 4 Kokai No. 5-295090
Patent Publication 5 Kokai No. 2001-261789
Non-patent Literature Publication 1: Written by WANG C-S, SHIEH J-Y, "Synthesis and properties of epoxy resins containing 2-(6-oxid-6H-dibenz<c,e><1,2>oxaphosphorin-6-yl)1,4-benzenediol", Polymer (GBR) VOL. 39, NO, 23, PAGE. 5819-5826 1998

Non-patent Literature Publication 2: Written by CHO C-S, CHEN L-W, CHIU Y-S, "Novel flame retardant epoxy resins. I. Synt-hesisi, characterization and properties of aryl phosphinate epoxy ether cured with diamine." Polymer Bulletin VOL. 41, NO. 1, PAGE. 45-52 1998

Patent Publication 1 and Patent Publication 2 propose flame-retardant films using a thermoplastic polyhydroxy polyether resin. However, all the flame retardants used therein are halogenated substances. Flame retardation using phosphorus is not described. In addition, Non-patent Literature Publication 1 describes a compound obtained by the addition reaction of a phosphorus-containing compound with benzoquinone as a flame-retardant compound using a phosphorus compound. However, it is used as a reactive flame retardant for epoxy resins which are thermocurable resins. There is no description relating to a thermoplastic resin and an insulating film. Non-patent Literature Publication 2 describes that a novel epoxy resin was obtained as a thermocurable resin using a phosphorus-containing compound, benzquinone and epichlorohydrin, but does not describe a thermoplastic resin and an insulating film.

Further, in Patent Publication 3, a phosphorus atom-containing flame-retardant thermoplastic resin was obtained, and the resin exhibited an improved heat resistance. However, the film thereof is hard and brittle and the resin exhibits selectivity of a solvent, and thus there are concerns that there may be an adverse effect that a solvent harmful to human bodies needs to be used, and the solubility thereof in a solvent must be improved. Recently, adaptability of a resin in the use where more flexibility is required, such as use of a resin for flexible laminates and the like has been demanded. In addition, in the use of a resin for adhesives, flexibility thereof at a low temperature has been demanded, and it is difficult to make conventional phenoxy resins exhibit sufficient flexibility. Patent Publication 4 and Patent Publication 5 describe a glycidyl ester type epoxy resin as one of bifunctional epoxy resins which are materials for a high molecular epoxy resin (equivalent to the "thermoplastic polyhydroxy polyether resin" of the present invention). However, there is no description relating to a characteristic of carboxylic acid-containing thermoplastic polyhydroxy polyether resins and there is no description relating to flame retardancy.

DISCLOSURE OF INVENTION

The object of the present invention is to provide a thermoplastic polyhydroxy polyether resin which exhibits almost the same viscosity as conventional thermoplastic polyhydroxy polyether resins, exhibits, by itself, flame retardancy without using a halogenated substance, exhibits a low elasticity and an excellent flexibility, does not have a solvent selectivity, can be dissolved in a solvent harmless to human bodies, and is excellent in compatibility with various rubber components and thermoplastic components, insulating films made from the resin, epoxy resin compositions for interlayer insulators, and adhesive films, prepregs and the like using them.

A flame-retardant thermoplastic polyhydroxy polyether resin which comprises 1 to 5 wt % of a phosphorus atom derived from a specific phosphorus compound, and 2 to 52 mol % of at least one epoxy resin-derived component selected from glycidyl esters of divalent aliphatic carboxylic acids having 15 to 64 carbon atoms or glycidyl ethers of divalent aliphatic alcohols having 15 to 64 carbon atoms, and has a weight average molecular weight of 10,000 to 200,000, resin compositions comprising it and electrolaminates prepared from them are obtained. Namely, in the present invention, a thermoplastic polyhydroxy polyether resin which is obtained by reacting at least one epoxy resin (A) selected from glycidyl esters of divalent aliphatic carboxylic acids having 15 to 64 carbon atoms or glycidyl ethers of divalent aliphatic alcohols having 15 to 64 carbon atoms with a phosphorus atom-containing divalent phenol compound (B) as essential components, wherein the amount of the component (A) is 2 to 52 mol % with respect to the whole resin, the thermoplastic polyhydroxy polyether resin has a weight average molecular weight of 10,000 to 200,000 (the weight average molecular weight in terms of standard polyethylene oxide as determined by gel permeation chromatography (GPC) using 20 mM lithium bromide-containing N,N-dimethyl formaldehyde as an eluent at a sample concentration of 0.5%. The molecular weight described hereinafter means a weight average molecular weight determined by this determination method.), has a phosphorus content of 1 to 5 wt %, and exhibits, by itself, flame retardancy, resin compositions comprising it and electrolaminates prepared from them can be obtained.

BEST MODE FOR CARRYING OUT THE INVENTION

Regarding the thermoplastic polyhydroxy polyether resin of the present invention, if the molecular weight is less than 10,000, thermoplasticity is lost and the resin does not exhibit a self-film forming property. In addition, if the molecular weight thereof is more than 200,000 and the thermoplastic polyhydroxy polyether resin is dissolved in a solvent, the solution viscosity thereof at a solvent concentration of from 70 to 40 wt % generally used in industries is extremely high, and thus a large amount of a solvent must be added so as to achieve a solution viscosity at which a film can be formed. It is not economically effective, and is not preferable in the situation where VOC (volatile organic compounds) are tried to be reduced as much as possible for the environment. Therefore, the molecular weight of the resin is preferably 11,000 to 100,000, more preferably 12,000 to 65,000.

The thermoplastic polyhydroxy polyether resin of the present invention can be obtained by the addition polymerization reaction of a generally known bifunctional epoxy resin with a divalent phenol compound. It is preferable that the addition equivalent ratio of the bifunctional epoxy resin to the divalent phenol used in the production of the resin is such that phenolic hydroxyl group: epoxy group=0.9:1 to 1.1:1. If the addition equivalent ratio is less than 0.9 and is more than 1.1, a resin having a sufficiently high molecular weight cannot be obtained. It is more preferably 0.94:1 to 1.06:1, the most preferably 0.97:1 to 1.03:1.

The phosphorus-containing divalent phenol compound is added as an essential component to the divalent phenol compound used in the production of the thermoplastic polyhydroxy polyether resin of the present invention such that the phosphorus content in the thermoplastic polyhydroxy polyether resin is 1 to 5 wt %. If the phosphorus content is less than 1 wt %, sufficient flame retardancy cannot be imparted. If it is 1 wt % or more, flame retardancy can be imparted at any concentration. If it is 5 wt % or more, the flexibility of a film comprising the resin extremely decreases. In addition, the solubility thereof in a solvent extremely decreases, and thus the resin can be only dissolved in a specific solvent. Therefore, it is necessary that the phosphorus content should be controlled to the range of 1 to 5 wt %, more preferably 1.5 to 4.5 wt %.

The phosphorus-containing divalent phenol compound especially suitable for the present invention is a phosphorus-containing divalent phenol compound represented by the general formula (1) or the general formula (2).

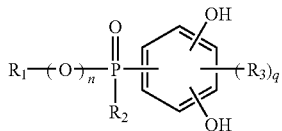

(1)

In the formula, $R_1$ and $R_2$ are C1-C12 aliphatic hydrocarbon group, an aryl group or a substituted aryl group, or may bond together to form a cyclic structure. In the formula, $R_3$ is a C1-C6 hydrocarbon group, q represents an integer of 0 to 3, and n represents an integer of 0 or 1.

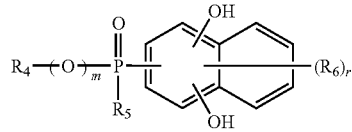

(2)

In the formula, $R_4$ and $R_5$ are C1-C12 aliphatic hydrocarbon group, an aryl group or a substituted aryl group, or may bond together to form a cyclic structure. In the formula, $R_6$ is a C1-C6 hydrocarbon group, r represents an integer of 0 to 5, and m represents an integer of 0 or 1.

Specific examples of these phosphorus-containing divalent phenol compounds include HCA-HQ (10-(2,5-dihydroxyphenyl)-10-dihydro-9-oxa-10-phosphaphenanthren-10-oxide, manufactured by Sanko Chemical Co., Ltd.), 10-(2,7-dihydroxynaphthyl)-10-dihydro-9-oxa-10-phosphaphenantren-10-oxide, PPQ (diphenylphosphinyl hydroquinone manufactured by HOKKO CHEMICAL INDUSTRY CO., LTD.), diphenylphosphinyl naphthoquinone, CPHO-HQ (cyclooctylene phosphinyl-1,4-benzenediol, manufactured by Nippon Chemical Industrial Co., Ltd.), cyclooctylene phosphinyl-1,4-naphthalenediol and the like. It is not particularly limited to them. In addition, two or more thereof may be used.

Divalent phenol compounds other than the phosphorus-containing divalent phenol compound used in the production of the thermoplastic polyhydroxy polyether resin of the present invention may be any compounds in which two hydroxyl groups are bonded to an aromatic ring. Examples thereof include bisphenols such as bisphenol A, bisphenol F, bisphenol B, bisphenol D, bisphenol E, bisphenol S, bisphenol Z, bisphenol fluorene, biscresol fluorene and the like, biphenol, catechol, resorcin, hydroquinone, 2,5-di-t-butylhydroquinone and the like. However, it is not particularly limited to them. These divalent compounds may be used alone, or two or more thereof may be used in combination.

The bifunctional epoxy resin used in the production of the thermoplastic polyhydroxy polyether resin of the present invention may be any compound having two epoxy groups in the molecule. Examples thereof include bisphenol type epoxy resins such as a bisphenol A type epoxy resin, a bisphenol F type epoxy resin, a bisphenol S type epoxy resin, a bisphenol Z type epoxy resin, a bisphenol fluorene type epoxy resin and the like, biphenol type epoxy resins, diglycidyl ethers of monocyclic divalent phenols such as catechol, resorcin, hydroquinone and the like, diglycidyl esters of divalent carboxylic acids such as phthalic acid, isophthalic acid, tetrahydrophthalic acid, hexahydrophthalic acid, dimer acids and the like, and diglycidyl ethers of aliphatic divalent alcohols such as 1,6-hexanediol, 1,8-octanediol, 1,10-decandiol, propylene glycol and the like. However, it is not particularly limited to them.

These bifunctional epoxy resins may be used alone, or two or more thereof may be used in combination. The purities of the terminal groups of these bifunctional epoxy resins are not particularly defined, but it is preferable that the hydrolyzable chlorine is 500 ppm or less and the α-diol content is 10 meq/100 g or less so as to obtain a produced thermoplastic polyhydroxy polyether resin having a sufficiently high molecular weight.

In the present invention, in order to make the thermoplastic polyhydroxy polyether resin flexible and to achieve a low elasticity, a low stress behavior and high elongation of the resin, at least one epoxy resin selected from glycidyl esters of divalent aliphatic carboxylic acids having 15 to 64 carbon atoms or glycidyl ethers of divalent aliphatic alcohols having 15 to 64 carbon atoms is introduced in an amount of 2 to 52 mol % with respect to all the functional groups. If it is less than 2 mol %, a sufficient flexibility cannot be imparted. If it is used in an amount of 52 mol % or more, reduction in flame retardancy and heat resistance is remarkable. Therefore, it is necessary to be adjusted to the range of 2 to 52 mol %, preferably 4 to 40 mol %, more preferably 5 to 30 mol %.

In addition, if the number of carbon atoms of the divalent aliphatic carboxylic acid or divalent aliphatic alcohol is less than 15, sufficient flexibility and elongation cannot be imparted. If the number of the carbon atoms thereof is 64 or more, reduction in flame retardancy and heat resistance is remarkable, and thus it is necessary to use a skeleton having 15 to 64 carbon atoms. The skeleton of the carboxylic acid or alcohol may be any structure of a bifunctional aliphatic group having 15 to 64 carbon atoms. It may be linear or branched, and may comprise a cyclic aliphatic group, an unsaturated linkage group, a heterocycle and a heteroatom in the skeleton.

Examples of the divalent aliphatic carboxylic acids having 15 to 64 carbon atoms include aliphatic dicarboxylic acids such as 2-dodecyl succinic acid, hexadecanedioic acid, 8-hexadecenedioic acid, 8,9-diethyl hexadecanedioic acid, eicosanedioic acid, 7-vinyltetradecanedioic acid, 1,16-(6-ethylhexadecane)dicarboxylic acid, 1,18-(7,12-octadecadiene)dicarboxylic acid, 1,12-(diethyldodecane)dicarboxylic acid and the like, dimer acids in which the main component obtained by intermolecular reaction of two or more unsaturated fatty acids (linoleic acid, oleic acid and the like) is a dibasic acid having 36 carbon atoms, hydrogenated dimer acids obtained by hydrogenation of the dimer acids and the like. However, they are not particularly limited. Epoxy resins of glycidyl esters of divalent aliphatic carboxylic acids having 15 to 64 carbon atoms can be obtained by the diglycidyl esterification of these divalent aliphatic carboxylic acids using a publicly known epoxidation technique.

Examples of the divalent aliphatic alcohols having 15 to 64 carbon atoms include long chain aliphatic diols such as 1,15-pentadecanediol, 1,16-hexadecanediol, 1,18-octadecanediol, 1,19-nonadecanediol and the like, polyethylene glycols such as octaethylene glycol, nonaethylene glycol and the like, polypropylene glycols such as pentapropylene glycol, hexapropylene glycol and the like, cyclic ring-containing diols such as 4,4'-(propan-2,2-diyl)bis(cyclohexanol) and the like, dimer diols and hydrogenated dimer diols in which the carboxyl group of the above-described dimer acids and hydrogenated dimer acids is reduced to a hydroxyl group. However, it is not particularly limited to them. Epoxy resins of glycidyl ethers of divalent aliphatic alcohols having 15 to 64 carbon atoms can be obtained by the diglycidyl etherification of these divalent aliphatic alcohols using a publicly known epoxidation technique.

The catalyst used in the production of the thermoplastic polyhydroxy polyether resin of the present invention may be any compound which exhibits a catalytic ability by which the reaction of an epoxy group with a phenolic hydroxyl group proceeds. Examples thereof include alkali metal compounds, organic phosphorus compounds, tertiary amines, quaternary ammonium salts, cyclic amines, imidazoles and the like. Specific examples of the alkali metal compounds include alkali metal hydroxides such as sodium hydroxide, lithium hydroxide, potassium hydroxide and the like, alkali metal salts such as sodium carbonate, sodium bicarbonate, sodium chloride, lithium chloride, potassium chloride and the like, alkali metal alkoxides such as sodium methoxide, sodium ethoxide and the like, alkali metal phenoxide, sodium hydride, lithium hydride and the like, alkali metal salts of organic acids such as sodium acetate and the like.

Specific examples of the organic phosphorus compounds include tri-n-propylphosphine, tri-n-butylphosphine, triphenylphosphine, tetramethylphosphonium bromide, tetramethylphosphonium iodide, tetramethylphosphonium hydroxide, trimethylcyclohexylphosphonium chloride, trimethylcyclohexylphosphonium bromide, trimethylbenzylphosphonium chloride, trimethylbenzylphosphonium bromide, tetraphenylphosphonium bromide, triphenylmethylphosphonium bromide, triphenylbutylphosphonium bromide, triphenylmethylphosphonium iodide, triphenylethylphosphonium chloride, triphenylethylphosphonium bromide, triphenylethylphosphonium iodide, triphenylbenzylphosphonium chloride, triphenylbenzylphosphonium bromide and the like.

Specific examples of the tertiary amines include triethylamine, tri-n-propylamine, tri-n-butylamine, triethanolamine, benzyldimethylamine and the like. Specific examples of the quaternary ammonium salts include tetramethylammonium chloride, tetramethylammonium bromide, tetramethylammonium hydroxide, triethylmethylammonium chloride, tetraethylammonium chloride, tetraethylammonium bromide, tetraethylammonium iodide, tetrapropylammonium bromide, tetrapropylammonium hydroxide, tetrabutylammonium chloride, tetrabutylammonium bromide, tetrabutylammonium iodide, benzyltrimethylammonium chloride, benzyltrimethylammonium bromide, benzyltrimethylammonium hydroxide, benzyltributylammonium chloride, phenyltrimethylammonium chloride and the like.

Specific examples of the imidazoles include 2-methylimidazole, 2-ethyl-4-methylimidazole, 2-phenylimidazole and the like. Specific examples of the cyclic amines include 1,8-diazabicyclo(5,4,0)undecen-7,1,5-diazabicyclo(4,3,0)nonene-5 and the like.

These catalysts can be used in combination. The used amount of the catalyst is generally 0.001 to 1 wt %. The used amount is not particularly limited. However, it has been known that when an alkali metal compound is used, there is an alkali metal residue in the thermoplastic polyhydroxy polyether resin, and it extremely decreases the insulating property of electric and electronic parts comprising the same, depending on the residue amount. Therefore, it is preferable that the total content of the alkali metals in the thermoplastic polyhydroxy polyether resin is 10 ppm or less.

In addition, it has been known that when a tertiary amine, a quaternary ammonium salt, a cyclic amine, an imidazole or the like is used as the catalyst, there is a catalyst residue in the thermoplastic polyhydroxy polyether resin, and it extremely decreases the insulating property of electric and electronic parts comprising the same, depending on the residue amount, in the same manner as the residue of the alkali metal compound. Therefore, it is preferable that the nitrogen content in the thermoplastic polyhydroxy polyether resin is 150 ppm or less.

For the thermoplastic polyhydroxy polyether resin of the present invention, a solvent may be used at the synthesis reaction step in the production thereof. Any solvents capable of dissolving the thermoplastic polyhydroxy polyether resin can be used as the solvent. Examples thereof include aromatic type solvents, ketone type solvents, amide type solvents, glycol ether type solvents and the like. Specific examples of the aromatic type solvents include benzene, toluene, xylene and the like. Specific examples of the ketone type solvents include acetone, methyl ethyl ketone, methyl isobutyl ketone, 2-heptanone, 4-heptanone, 2-octanone, cyclohexanone, cyclopentanone, acetyl acetone, dioxane and the like.

Specific examples of the amide type solvents include formamide, N-methylformamide, N,N-dimethylformamide, acetamide, N-methylacetamide, N,N-dimethylacetamide, 2-pyrrolidone, N-methylpyrrolidone and the like. Specific examples of the glycol ether type solvents include ethylene glycol monomethyl ether, ethylene glycol monoethyl ether, ethylene glycol mono-n-butyl ether, ethylene glycol dimethyl ether, ethylene glycol monoethyl ether acetate, diethylene glycol monomethyl ether, diethylene glycol monoethyl ether, diethylene glycol mono-n-butyl ether, diethylene glycol dimethyl ether, diethylene glycol monoethyl ether acetate, propylene glycol monomethyl ether, propylene glycol mono-n-butyl ether, propylene glycol monomethyl ether acetate and the like.

These solvents may be used in combination. When these solvents are used in the synthetic reaction, it is preferable that the solid concentration of these solvents is 35 to 95%. In addition, a reaction can be continued by adding a solvent in the reaction. When the reaction is completed, a solvent may be removed or may be further added, as necessary.

The polymerization reaction for the production of the thermoplastic polyhydroxy polyether resin of the present invention should be performed at a reaction temperature at which the used catalyst is not decomposed. The reaction temperature is preferably 50 to 230° C., more preferably 60 to 210° C., especially preferably 90 to 190° C. The reaction pressure is generally normal pressure. If there is a need to remove reaction heat, a flash evaporation method, a condensation reflux method, an indirect cooling method or a combination thereof may be used. In addition, when a solvent having a low boiling point such as acetone and methyl ethyl ketone is used, a reaction temperature can be assured by the reaction under a high pressure using an autoclave.

The thermoplastic polyhydroxy polyether resin of the present invention is a flame-retardant, heat-resistant and flexible substance. It may be used alone. However, a variety of materials including an epoxy resin, a thermocurable resin other than epoxy resins, a curing agent, a curing accelerator, a solvent, an inorganic filler, a fibrous material and the like can be used with the thermoplastic polyhydroxy polyether resin of the present invention as an essential component. Examples of the epoxy resin used in the present invention are various epoxy resins including glycidyl ether type epoxy resins such as a bisphenol A type epoxy resin, a bisphenol F type epoxy resin, a bisphenol S type epoxy resin, a biphenyl type epoxy resin, a phenol novolac type epoxy resin, a cresol novolac type epoxy resin and the like, glycidyl ester type epoxy resins, glycidyl amine type epoxy resins, linear aliphatic epoxy resins, alicyclic epoxy resins, heterocyclic epoxy resins and the like.

As the thermocurable resin other than epoxy resins, for example, a polyimide resin, a thermocurable polyphenylene ether resin, a cyanate ester resin and the like may be used. In addition, as the curing agent used in the present invention, for example, an aromatic polyamine, dicyandiamide, an anhydride of an acid, various phenol type curing agents such as a phenol novolac resin, an alkylphenol novolac resin, a bisphenol A novolac resin, a dicyclopentadiene type phenol resin, a phenol aralkyl resin, a terpene modified phenol resin, a polyvinyl phenol and the like may be used alone, or two or more thereof may be used in combination.

Further, a phenol type curing agent containing a nitrogen atom may be used. When a phenol type curing agent is used, flame retardancy and an adhesive property of the resin are improved. As the phenol type curing agent containing a nitrogen atom include a triazine structure-containing novolac resin, PHENOLITE 7050 series manufactured by DIC Corporation, a melamine-modified phenol novolac resin manufactured by Yuka Shell K.K., aminotriazine novolac resin PS-6313 manufactured by Gun Ei Chemical Industry Co., Ltd and the like. Regarding the added amount of the above phenol resin, it is preferable that a phenol resin having a phenolic hydroxyl group equivalent of 0.5 to 1.3 is added to an epoxy resin having an epoxy equivalent of 1. If the added amount is not within the range, a problem that the heat resistance of the obtained epoxy resin composition is lost occurs.

Further, as the curing accelerator thereof, publicly known and generally used compounds, for example, organic phosphine type compounds such as triphenylphosphine, tetraphenylphosphonium.tetraphenylborate and the like as well as benzyldimethylamine, guanidines, various imidazoles, tertiary amines or microcapsules thereof may be used alone, or two or more thereof may be in combination.

Further, a solvent may be added, as necessary. Examples of the solvent include acetone, methyl ethyl ketone, toluene, xylene, methyl isobutyl ketone, ethyl acetate, ethylene glycol monomethyl ether, N,N-dimethylformamide, N,N-dimethylacetamide, methanol, ethanol and the like. These solvents may be used alone, or two or more thereof may be used as a mixture solvent.

As other non-essential components, an ultraviolet protective agent, a plasticizer or the like for preservation stability, aluminum oxide, alumina, calcium carbonate, silica or the like as an inorganic filler, a silane coupling agent, a titanate type coupling agent or the like as a coupling agent may be used as far as physical properties of the resin are not reduced. In addition, a non-halogenated P type, N type or silicon type flame retardant or the like may be added to increase flame retardancy. Further, in order to improve the flexibility and adhesive property of the resin, a polyester type, polyvinyl butyral type, acrylic type, polyamide type thermoplastic polymer substance or the like and a rubber component such as NVRBCTBN, VTBN or the like may be added. For example, Nipol 1072 which is a product manufactured by ZEON CORPORATION, PNR-1H and N-632S which are products manufactured by JSR Corporation, RLP and CTBN-1008 which are products manufactured by Ube Industries, Ltd. and the like per se may be used.

In addition, an organic and/or inorganic filler may be added to the curable resin composition of the present invention so as to improve the mechanical strength and flame retardancy of a cured product thereof. The organic filler includes acrylic rubber fine particle having a core-shell structure, a silicon powder, a nylon powder and the like. The inorganic filler includes silica, alumina, magnesium hydroxide, aluminum hydroxide, zinc borate, antimony oxide and the like. The fibrous inorganic insulating material includes potassium titanate. These inorganic fillers may be used after being subjected to the surface treatment with a silane type coupling agent or the like disclosed in Kokai No. 2000-121629.

Further, a high-dielectric inorganic filler include barium titanate, strontium titanate, calcium titanate, magnesium titanate, bismuth titanate, zirconium titanate, zinc titanate, titanium dioxide and the like. They may be used alone, or two or more thereof may be used in combination. These dielectric inorganic fillers may be used after being subjected to the surface treatment with a silane type coupling agent or the like disclosed in Kokai No. 2000-121629.

EXAMPLES

The present invention will be specifically explained, based on the examples and the comparative examples thereof. However, the scope of the present invention is not limited to these examples. In the following examples and comparative examples, "part(s)" means "part(s) by weight". In the present invention, the following test method is used.

(1) Molecular weight: The weight average molecular weight in terms of standard polyethylene oxide as determined by gel permeation chromatography (GPC) using N,N-dimethylformamide (20 mM lithium bromide-containing product) as an eluent.

(2) Epoxy equivalent: Determined in accordance with JIS K-7236, and the obtained value was converted to the value of a solid resin component.

(3) Nonvolatile component: Determined in accordance with JIS K-7235.

(4) Hydrolyzable chlorine: After the resin was reacted in hot water at 70° C. using a 1N-KOH methanol solution for 30 minutes, hydrolyzable chlorine was determined by potentiometer titration, and the obtained value was converted to the value of the solid resin component.

(5) α-Diol content: Determined by potentiometer titration using periodic acid and sodium thiosulfate, and the obtained value was converted to the value of the solid resin component.

(6) Phosphorus content: Determined by a fluorescence X-ray device, and the obtained value was converted to the value of the solid resin component.

(7) Glass transition temperature: Determined by a thermomechanical measurement apparatus (TMA) at a rate of a temperature increase of 5° C./minute from −20° C.

(8) Elastic modulus: Determined in accordance with JIS K-7127 at a testing rate of 5 mm/min, using a test piece type 5 (JIS K 7127/5/5).

(9) Elongation: Determined in accordance with JIS K-7127 at a testing rate of 5 mm/min, using a test piece type 5 (JIS K 7127/5/5).

(10) Adhesive force: Determined in accordance with JIS K6854-1 in an autograph in the atmosphere at 25° C. at 50 mm/min.

(11) Combustion characteristic: Evaluated by vertical strategy in accordance with the UL-94 standard.

Example 1

A dimer acid polyglycidyl ester resin (YD-171 manufactured by Tohto Kasei Co., Ltd., having an epoxy equivalent of 435 g/eq) was subjected to a treatment under the conditions at a recovery temperature of 200° C., at a recovery pressure of 0.1 Pa and at 5 ml/min for four hours using a thin-layer vacuum distillation apparatus (a distillation apparatus for a short process type KD4, manufactured by UIC GmbH) to obtain 600 g of epoxy resin A having an epoxy equivalent of 410 g/eq, a hydrolyzable chlorine of 500 ppm, an α-diol content of 4 meq/100 g, and a viscosity at 25° C. of 700 mPa·s.

154 parts of the epoxy resin A, 74 parts of a bisphenol A type epoxy resin (YD-128 manufactured by Tohto Kasei Co., Ltd., having an epoxy equivalent of 187 g/eq, a hydrolyzable chlorine of 200 ppm and an α-diol content of 5 meq/100 g), 122 parts of HCA-HQ (10-(2,5-dihydroxyphenyl)-10H-9-oxa-10-phosphaphenantren-10-oxide, manufactured by Sanko, having a hydroxyl group equivalent of 162 g/eq and a phosphorus content of 9.5%) as the phosphorus-containing phenol, 150 parts of cyclohexanone and 0.07 part of 2-ethyl-4-methylimidazole (manufactured by SHIKOKU CHEMICALS CORPORATION, referred to as 2E4MZ, hereinafter) as the catalyst were charged into a four-neck separable flask made of glass equipped with a stirrer, a thermometer, a cooling tube and a nitrogen gas inlet apparatus, and were reacted at normal pressure, at a temperature of 150 to 170° C. for nine hours, and then 175 parts of cyclohexanone and 325 parts of methyl cellosolve were added to obtain 985 parts of a cyclohexanone methyl cellosolve mixture varnish of a thermoplastic polyhydroxy polyether resin having an epoxy equivalent of 15,600 g/eq, a phosphorus content of 3.3%, a solid concentration (referred to as NV, hereinafter) of 35%, and a weight average molecular weight of 50,000.

This resin was named synthetic resin varnish I. The synthetic resin varnish I was coated on a release film (PET) using a roller coater such that the thickness of the resin after the solvent was dried was 60 μm. After the solvent was dried at 140 to 160° C. for 30 to 60 minutes, the resin film was removed from the release film to obtain an insulating film. Further, the obtained insulating film and 35 μm copper foil (3EC-III, manufactured by MITSUI MINING & SMELTING CO., LTD.) were placed on a standard test plate (PM-3118M manufactured by Nippon Testpanel Co., Ltd.), and were laminated using a dry laminator at 160° C. to obtain a test piece for determining copper foil peeling strength.

Further, the insulating film with a release paper was placed on an article prepared by removing a copper foil from CCL-HL830 (a copper-clad laminate manufactured by MITSUBISHI GAS CHEMICAL COMPANY, INC., UL-94V-0, a 0.8 mm plate), and was laminated using a dry laminator at 160° C. Then, the release film was removed to obtain a test piece for determining a combustion characteristic. Further, one part of PNR-1H (manufactured by JSR Corporation, a low ionic and polyfunctional NBR containing a carboxyl group, an acid equivalent of 1,395 g/eq, a CN content of 27%, and a Mooney viscosity of 60) as a rubber was mixed and dissolved, with respect to 9 parts of the solid component of the synthetic resin varnish I to obtain a test sample for determining the rubber compatibility. In the visual evaluation, a compatible sample was evaluated as ○, and a separated and clouded sample was evaluated as x. In addition, 10 parts of MEK was dissolved in 90 parts of the synthetic resin varnish I to prepare an MEK compatible test sample. In the visual evaluation, a compatible sample was evaluated as ○, and a separated and clouded sample was evaluated as x.

Example 2

239 parts of a dimer diol diglycidyl ether resin (FX-318 manufactured by Tohto Kasei Co., Ltd., having an epoxy equivalent of 368 g/eq, a hydrolyzable chlorine of 200 ppm, an α-diol component of 2.3 meq/100 g, and a viscosity at 25° C. of 200 mPa·s), 3 parts of the bisphenol A type epoxy resin YD-128 (described above), 49 parts of the HCA-HQ (described above) as the phosphorus-containing phenol, 57 parts of 9,9'-bis(4-hydroxyphenyl)fluorene (manufactured by Nippon Steel Chemical Co., Ltd., having a hydroxyl group equivalent of 175 g/eq), 150 parts of cyclohexanone and 0.35 part of triphenylphosphine (manufactured by HOKKO CHEMICAL INDUSTRY CO., LTD., referred to as TPP, hereinafter) as the catalyst were charged into a four-neck separable flask made of glass equipped with a stirrer, a thermometer, a cooling tube and a nitrogen gas inlet apparatus, and were reacted at normal pressure at a temperature of from 150 to 170° C. for 18 hours.

Next, 175 parts of cyclohexanone and 325 parts of methyl cellosolve were added to obtain 985 parts of a cyclohexanone and methyl cellosolve mixture varnish of a thermoplastic polyhydroxy polyether resin having an epoxy equivalent of 7,100 g/eq, a phosphorus content of 1.3%, an NV. of 35% and a weight average molecular weight of 30,000. This resin was named synthetic varnish II. Completely the same procedural steps were performed as in Example 1 except that the synthetic resin varnish II was used to obtain insulating films, test pieces for determining copper foil peeling strength, test pieces for determining a combustion characteristic, test samples for determining rubber compatibility and test samples for determining MEK compatibility.

Example 3

112 parts of the dimer diol diglycidyl ether resin FX-318 (described above), 134 parts of the bisphenol A type epoxy resin YD-128 (described above), 155 parts of diphenylphosphinyl hydroquinone (having a hydroxyl group equivalent of 155 g/eq and a phosphorus content of 10.0%) as the phosphorus-containing phenol, 170 parts of cyclohexanone and 0.4 part of TPP (described above) as the catalyst were charged into a four-neck separable flask made of glass equipped with a stirrer, a thermometer, a cooling tube and a nitrogen gas inlet apparatus, and were reacted at normal pressure at a temperature of 150 to 170° C. for eight hours, and then 130 parts of cyclohexanone and 300 parts of methyl cellosolve were added to obtain 990 parts of a cyclohexanone and methyl cellosolve mixture varnish of a thermoplastic polyhydroxy polyether resin having an epoxy equivalent of 16,000 g/eq, a phosphorus content of 3.9%, an NV. of 40% and a weight average molecular weight of 44,000.

This resin was named the synthetic resin varnish III. Completely the same procedural steps were performed as in Example 1 except that the synthetic resin varnish III was used to obtain insulating films, test pieces for determining copper foil peeling strength, test pieces for determining a combustion characteristic, test samples for determining rubber compatibility and test samples for determining MEK compatibility.

Example 4

19 parts of a polypropylene diglycidyl ester resin (PG-207S manufactured by Tohto Kasei Co., Ltd., having an epoxy equivalent of 289 g/eq, a hydrolyzable chlorine of 500 ppm and an α-diol content of 5 meq/100 g), 205 parts of a bisphenol type epoxy resin (YDC-1500 manufactured by Tohto Kasei Co., Ltd., having an epoxy equivalent of 194 g/eq, a hydrolyzable chlorine of 120 ppm and an α-diol content of 2 meq/100 g), 176 parts of HCA-HQ (described above) as the phosphorus-containing phenol, 170 parts of cyclohexanone and 0.08 part of 2E4MZ (described above) as the catalyst were charged into a four-neck separable flask made of glass equipped with a stirrer, a thermometer, a cooling tube and a nitrogen gas inlet apparatus, were reacted at normal pressure, at a temperature of 150 to 170° C. for eight hours, and then 130 parts of cyclohexanone and 300 parts of methyl cellosolve were added to obtain 990 parts of a cyclohexanone and methyl cellosolve mixture varnish of a thermoplastic polyhydroxy polyether resin having an epoxy equivalent of 9,400 g/eq, a phosphorus content of 4.2%, an NV. of 40% and a weight average molecular weight of 41,000.

This resin was named synthetic resin varnish IV. Completely the same procedural steps were performed as in Example 1 except that the synthetic resin varnish IV was used to obtain insulating films, tests piece for determining copper foil peeling strength, test pieces for determining a combustion characteristic, test samples for determining rubber compatibility and test samples for determining MEK compatibility.

Example 5

229 parts of the dimer diol diglycidyl ether resin FX-318 (described above), 111 parts of HCA-NQ (a reaction product of 9,10-dihydro-9-oxa-10-phenanthren-10-oxide with 1,4-naphthoquinone, having a hydroxyl group equivalent of 187 g/eq and a phosphorus content of 8.2%) as the phosphorus-containing phenol, 145 parts of cyclohexanone and 0.07 part of 2E4MZ (described above) as the catalyst were charged into a four-neck separable flask made of glass equipped with a stirrer, a thermometer, a cooling tube and a nitrogen gas inlet apparatus, and were reacted at normal pressure at a temperature of 150 to 170° C. for ten hours, and then 170 parts of cyclohexanone and 315 parts of methyl cellosolve were added to obtain 955 parts of a cyclohexanone and methyl cellosolve mixture varnish of a thermoplastic polyhydroxy polyether resin having an epoxy equivalent of 7,800 g/eq, a phosphorus content of 2.7%, an NV. of 35% and a weight average molecular weight of 35,000.

This resin was named the synthetic resin varnish V. Completely the same procedural steps were performed as in Example 1 except that the synthetic resin varnish V was used to obtain insulating films, test pieces for determining copper foil peeling strength, test pieces for determining a combustion characteristic, test samples for determining rubber compatibility and test samples for determining MEK compatibility.

Comparative Example 1

189 parts of the bisphenol A type epoxy resin YD-128 (described above), 162 parts of HCA-HQ (described above) as the phosphorus-containing phenol, 150 parts of cyclohexanone and 0.07 part of 2E4MZ (described above) as the catalyst were charged into a four-neck separable flask made of glass equipped with a stirrer, a thermometer, a cooling tube and a nitrogen gas inlet apparatus, and were reacted at normal pressure at a temperature of 150 to 170° C. for 11 hours, and then 175 parts of cyclohexanone and 325 parts of N,N-dimethylformamide were added to obtain 990 parts of a cyclohexanone and N,N-dimethylformamide mixture varnish of a thermoplastic polyhydroxy polyether resin having an epoxy equivalent of 17,000 g/eq, a phosphorus content of 4.4%, an NV. of 35% and a weight average molecular weight of 60,500.

This resin was named synthetic resin varnish VI. Completely the same procedural steps were performed as in Example 1 except that the synthetic resin varnish VI was used to obtain insulating films, test pieces for determining copper foil peeling strength, test pieces for determining a combustion characteristic, test samples for determining rubber compatibility and test samples for determining MEK compatibility.

Comparative Example 2

23 parts of the polypropylene diglycidyl ether resin PG-207S (described above), 218 parts of the bisphenol A type epoxy resin YD-128 (described above), 32 parts of HCA-HQ (described above) as the phosphorus-containing phenol, 115 parts of bisphenol A (manufactured by Nippon Steel Corporation, having a hydroxyl group equivalent of 114 g/eq), 165 parts of cyclohexanone and 0.08 part of 2E4MZ as the catalyst were charged into a four-neck separable flask made of glass equipped with a stirrer, a thermometer, a cooling tube and a nitrogen gas inlet apparatus, and were reacted at normal pressure, at a temperature of 150 to 170° C. for 15 hours, and then 125 parts of cyclohexanone and 290 parts of methyl cellosolve were added to obtain 950 parts of a cyclohexanone and methyl cellosolve mixture varnish of a thermoplastic polyhydroxy polyether resin having an epoxy equivalent of 8,900 g/eq, a phosphorus content of 0.7%, an NV. of 40% and a weight average molecular weight of 41,000.

This resin was named synthetic resin varnish VII. Completely the same procedural steps were performed as in Example 1 except that the synthetic resin varnish VII was used to obtain insulating films, test pieces for determining copper foil peeling strength, test pieces for determining a combustion characteristic, test samples for determining rubber compatibility and test samples for determining MEK compatibility.

Comparative Example 3

400 parts of a bisphenol A type thermoplastic polyhydroxy polyether resin YP-50SC (manufactured by Tohto Kasei Co., Ltd, having an epoxy equivalent of 18,000 and a molecular weight of 45,000), 240 parts of cyclohexanone and 360 parts of methyl ethyl ketone were charged into a four-neck separable flask made of glass equipped with a stirrer, a thermometer, a cooling tube and a nitrogen gas inlet apparatus, and were mixed for three hours to completely dissolve the resin while the reaction temperature was maintained at 40 to 60° C. to obtain a cyclohexanone and methyl ethyl ketone mixture varnish having an NV. of 40%. This resin was named synthetic resin varnish VIII. Completely the same procedural steps were performed as in Example 1 except that the synthetic resin varnish VIII was used to obtain insulating films, test pieces for determining copper foil peeling strength, test pieces for determining a combustion characteristic, test samples for determining rubber compatibility and test samples for determining MEK compatibility.

The synthetic varnishes, the insulating films, the test pieces for determining copper foil peeling strength, the test pieces for determining a combustion characteristic, the test samples for determining rubber compatibility and the test samples for determining MEK compatibility were used for determining the molecular weight, the glass transition temperature, elastic modulus and elongation, the adhesive force, the flame retardancy, the rubber compatibility, and the MEK compatibility of the resins, respectively.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Weight average molecular weight | 50,000 | 30,000 | 44,000 | 41,000 | 35,000 | 60,500 | 41,000 | 45,000 |
| Phosphorus content (wt %) | 3.3 | 1.3 | 3.9 | 4.2 | 2.7 | 4.4 | 0.7 | 0 |
| Component (A) (mol %) | 25 | 50 | 15 | 3 | 51 | 0 | 3 | 0 |
| Glass transition temperature (° C.) | 25 | 20 | 68 | 101 | 35 | 142 | 103 | 85 |
| Adhesive force (Kgf/cm$^2$) | 1.8 | 1.9 | 1.7 | 1.6 | 2.0 | 1.6 | 1.8 | 1.4 |
| Flame retardancy (UL-94) | V-0 | V-0 | V-0 | V-0 | V-0 | V-0 | V-1 | NG |
| MEK compatibility | ○ | ○ | ○ | ○ | ○ | X | ○ | ○ |
| Rubber compatibility | ○ | ○ | ○ | ○ | ○ | X | ○ | ○ |
| Elastic modulus (GPa) | 0.5 | 0.4 | 0.5 | 0.6 | 0.3 | 1.0 | 0.6 | 1.0 |
| Elongation (%) | 31 | 90 | 26 | 15 | 120 | 3 | 15 | 7 |

Table 1 shows physical properties of the resins. Regarding Comparative Example 1, the component (A) in the thermoplastic polyhydroxy polyether resin was 0 mol %, which is smaller than 2 mol %, and the elastic modulus was 1.0 GPa, which is higher than that of Examples. In addition, the elongation was 3%, which is lower than that of Examples. Further, both the MEK compatibility and the rubber compatibility were X, which means that Comparative Example 1 exhibited poor compatibilities.

Regarding Comparative Example 2, the phosphorus content in the thermoplastic polyhydroxy polyether resin was 0.7 wt %, which is smaller than 1 wt %, and the flame retardancy (UL-94) was V-1, which means that it did not have sufficient flame retardancy, as compared with Examples. Regarding Comparative Example 3, the component (A) in the thermoplastic polyhydroxy polyether resin was 0 mol %, which is smaller than 2 mol %, and the elastic modulus was 1.0 GPa, which is higher than that of Examples. In addition, the elongation was 7%, which is lower than that of Examples. Further, the phosphorus content was 0 wt %, which is smaller than 1 wt %, and the flame retardancy (UL-94) was NG, which means that Comparative Example 3 did not have sufficient flame retardancy, as compared with Examples.

Example 6

285.7 parts of the synthetic resin varnish I obtained in Example 1, 25.0 parts of YD-128 (described above) as the epoxy resin, 1.4 parts of dicyandiamide (manufactured by NIPPON CARBIDE INDUSTRIES CO., INC., referred to as DICY, hereinafter) as the curing agent, 0.15 part of 2E4MZ (described above) as the curing accelerator, 20.0 parts of methyl cellosolve and 20.0 parts of dimethylformamide as solvents were added and were uniformly mixed to obtain an epoxy resin composition varnish. This composition varnish was coated on the release film (described above) using a roller coater such that the thickness of the resin after the solvents were dried became 60 μm. After the solvents were dried and the composition varnish was cured at 130 to 150° C. for 60 minutes, the resin film was removed from the release film, and the resin film was cured at 180° C. for 60 minutes to obtain a cured film.

In addition to the above process, the composition varnish was coated on a standard test plate (described above) using a roller coater such that the thickness of the resin after the solvents were dried became 50 μm. After the solvents were dried at 130 to 150° C. for 5 to 15 minutes, a 35 μm copper foil (described above) was placed thereon and was laminated using a dry laminator at 180° C. to obtain a test piece for determining copper foil peeling strength. In addition, the composition varnish was coated on an article prepared by removing a copper foil from the CCL-HL830 (described above) using a roller coater such that the thickness of the resin after the solvents were dried became 60 μm. After the solvents were dried at 140 to 160° C. for 30 to 60 minutes, the composition varnish was cured at 180° C. for 60 minutes to obtain a test piece for determining a combustion characteristic.

Example 7

A cured film, a test piece for determining copper foil peeling strength and a test piece for determining a combustion characteristic were obtained in exactly the same manner as in Example 6 except that 285.7 parts of the synthetic resin varnish II obtained in Example 2, 25.0 parts of YD-128 (described above) as the epoxy resin, 1.4 parts of DICY (described above) as the curing agent, 0.15 part of 2E4MZ (described above) as the curing accelerator, 20.0 parts of methyl cellosolve and 20 parts of dimethylformamide as solvents were added, and were uniformly mixed to obtain an epoxy resin composition varnish.

Example 8

A cured film, a test piece for determining copper foil peeling strength and a test piece for determining a combustion characteristic were obtained in exactly the same manner as in Example 6 except that 250.0 parts of the synthetic resin varnish III obtained in Example 3, 25.0 parts of YD-128 (described above) as the epoxy resin, 1.4 parts of DICY (described above) as the curing agent, 0.15 part of 2E4MZ (described above) as the curing accelerator, 20.0 parts of methyl cellosolve and 20 parts of dimethylformamide as solvents were added, and were uniformly mixed to obtain an epoxy resin composition varnish.

Example 9

A cured film, a test piece for determining copper foil peeling strength and a test piece for determining a combustion characteristic were obtained in exactly the same manner as in Example 6 except that 250.0 parts of the synthetic resin varnish IV obtained in Example 4, 25.0 parts of YD-128 (described above) as the epoxy resin, 1.4 parts of DICY (described above) as the curing agent, 0.15 part of 2E4MZ (described above) as the curing accelerator, 20.0 parts of methyl cellosolve and 20 parts of dimethylformamide as solvents were added, and were uniformly mixed to obtain an epoxy resin composition varnish.

Example 10

A cured film, a test piece for determining copper foil peeling strength and a test piece for determining a combustion characteristic were obtained in exactly the same manner as in Example 6 except that 285.7 parts of the synthetic resin varnish V obtained in Example 5, 25.0 parts of YD-128 (described above) as the epoxy resin, 1.4 parts of DICY (described above) as the curing agent, 0.15 part of 2E4MZ (described above) as the curing accelerator, 20.0 parts of methyl cellosolve and 20 parts of dimethylformamide as solvents were added, and were uniformly mixed to obtain an epoxy resin composition varnish.

Comparative Example 4

A cured film, a test piece for determining copper foil peeling strength and a test piece for determining a combustion characteristic were obtained in exactly the same manner as in Example 6 except that 285.7 parts of the synthetic resin varnish VI obtained in Comparative Example 1, 25.0 parts of YD-128 (described above) as the epoxy resin, 1.4 parts of DICY (described above) as a curing agent, 0.15 part of 2E4MZ (described above) as the curing accelerator, 20.0 parts of methyl cellosolve and 20 parts of dimethylformamide as solvents were added, were uniformly mixed to obtain an epoxy resin composition varnish.

Comparative Example 5

A cured film, a test piece for determining copper foil peeling strength and a test piece for determining a combustion characteristic were obtained in exactly the same manner as in Example 6 except that 250.0 parts of the synthetic resin varnish VII obtained in Comparative Example 2, 25.0 parts of YD-128 (described above) as the epoxy resin, 1.4 parts of DICY (described above) as the curing agent, 0.15 part of 2E4MZ (described above) as the curing accelerator, 20.0 parts of methyl cellosolve and 20 parts of dimethylformamide as solvents were added, were uniformly mixed to obtain an epoxy resin composition varnish.

Comparative Example 6

A cured film, a test piece for determining copper foil peeling strength and a test piece for determining a combustion characteristic were obtained in exactly the same manner as in Example 6 except that 250.0 parts of the synthetic resin varnish VII obtained in Comparative Example 3, 25.0 parts of YD-128 (described above) as the epoxy resin, 1.4 parts of DICY (described above) as the curing agent, 0.15 part of 2E4MZ (described above) as the curing accelerator, 20.0 parts of methyl cellosolve and 20 parts of dimethylformamide as solvents were added, were uniformly mixed to obtain an epoxy resin composition varnish.

The cured films, the test pieces for determining copper foil peeling strength and the test pieces for determining a combustion characteristic were used for determining the glass transition temperature and elastic modulus of the composition, the adhesive force of the composition and the flame retardancy of the composition, respectively.

TABLE 2

| | Example 6 | Example 7 | Example 8 | Example 9 | Example 10 | Comparative Example 4 | Comparative Example 5 | Comparative Example 6 |
|---|---|---|---|---|---|---|---|---|
| Glass transition temperature (° C.) | 68 | 59 | 110 | 112 | 70 | 142 | 106 | 95 |
| Adhesive force (Kgf/cm$^2$) | 1.9 | 2.0 | 1.8 | 1.9 | 2.2 | 1.7 | 2.0 | 1.7 |
| Flame retardancy (UL-94) | V-0 | V-0 | V-0 | V-0 | V-0 | V-0 | V-1 | NG |
| Elastic Modulus (GPa) | 0.6 | 0.5 | 0.6 | 0.7 | 0.4 | 1.2 | 0.7 | 1.2 |
| Elongation (%) | 22 | 34 | 19 | 10 | 53 | 2 | 9 | 4 |

Table 2 shows physical properties of cured products. Regarding Comparative Example 4, the component (A) in the thermoplastic polyhydroxy polyether resin was 0 mol %, which is smaller than 2 mol %, and the elastic modulus of the cured product was 1.2 GPa, which is higher than that of Examples. The elongation was 2%, which is lower than that of Examples. Regarding Comparative Example 5, the phosphorus content in the thermoplastic polyhydroxy polyether resin was 0.7 wt %, which is smaller than 1 wt %, and the flame retardancy (UL-94) of the cured product was V-1, which indicates that the flame retardancy of Comparative Example 5 was not sufficient, compared with Examples.

Regarding Comparative Example 6, the component (A) in the thermoplastic polyhydroxy polyether resin was 0 mol %, which is smaller than 2 mol %, and the elastic modulus of the cured product was 1.2 GPa, which is higher than that of Examples. In addition, the elongation thereof was 4%, which is lower than that of Examples. Further, the phosphorus content was 0 wt %, which is smaller than 1 wt %, and the flame retardancy (UL-94) of the cured product was NG, which indicates that the flame retardancy of Comparative Example 6 was not insufficient, compared with Examples.

INDUSTRIAL APPLICABILITY

When the thermoplastic polyhydroxy polyether resin of the present invention is used, a flame-retardant film which exhibits a low elastic modulus, is flexible, elongates and is excellent in adhesiveness and in which no halogens are used can be obtained. Use of the resin enables the production of an insulating film which exhibits a necessary and sufficient heat resistance and whose physical properties are not substantially decreased when used in a normal environment. Further, compatibility with rubbers and solvents is improved, and has a remarkable technical significance.

The invention claimed is:

1. A flame-retardant thermoplastic polyhydroxy polyether resin, wherein the flame-retardant thermoplastic polyhydroxy polyether resin is obtained by reacting at least one epoxy resin (A) selected from glycidyl esters of divalent aliphatic carboxylic acids having 15 to 64 carbon atoms or glycidyl ethers of divalent aliphatic alcohols having 15 to 64 carbon atoms with a phosphorus atom-containing divalent phenol compound (B) at a phenol group equivalent of 0.9 to 1.1 with respect to an epoxy group equivalent of 1, wherein the amount of the component (A) is 2 to 52 mol % with respect to the whole resin, the weight average molecular weight thereof is 10,000 to 200,000, and the phosphorus content thereof is 1 to 5 wt %, and elongation thereof is 15% to 120%.

2. The thermoplastic polyhydroxy polyether resin according to claim 1, wherein the phosphorus atom-containing divalent phenol compound is at least one phosphorus atom-containing divalent phenol compound selected from organic phosphorus compounds represented by the general formula (1) or the general formula (2):

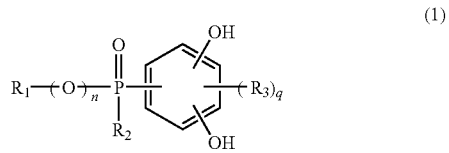

(1)

(in the formula, $R_1$ and $R_2$ each independently is a C1 to C12 aliphatic hydrocarbon group, an aryl group or a substituted aryl group or $R_1$ and $R_2$ bond together to form a cyclic structure, in the formula, $R_3$ is a C1 to C6 hydrocarbon group, q represents an integer of 0 to 3, and n represents an integer of 0 or 1)

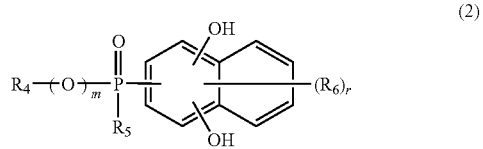

(2)

(in the formula, $R_4$ and $R_5$ each independently is a C1 to C12 aliphatic hydrocarbon group, an aryl group or a substituted aryl group or $R_4$ and $R_5$ bond together to form a cyclic structure, in the formula, $R_6$ is a C1 to C6 hydrocarbon group, r represents an integer of 0 to 5, and m represents an integer of 0 or 1).

3. The thermoplastic polyhydroxy polyether resin according to claim 1, wherein the divalent aliphatic carboxylic acid having 15 to 64 carbon atoms is at least one divalent aliphatic carboxylic acid selected from dimer acids or hydrogenated dimer acids.

4. The thermoplastic polyhydroxy polyether resin according to claim 1, wherein the divalent aliphatic alcohol having 15 to 64 carbon atoms is at least one divalent aliphatic alcohol selected from dimer diols or hydrogenated dimer diols.

5. A resin composition comprising the thermoplastic polyhydroxy polyether resin according to claim 1, a thermocurable resin and a curing agent as essential components.

6. The resin composition according to claim 5, wherein the thermocurable resin is an epoxy resin.

7. The resin composition according to claim 5, further comprising a polyester type, polyvinyl butyral type, acrylic type or polyamide type thermoplastic polymeric substance and/or a rubber component.

8. An adhesive film comprising a support base film having formed thereon an insulating film made of the thermoplastic polyhydroxy polyether resin according to claim 1 and a thin film.

9. A copper foil with a resin for a printed circuit board and a copper foil with a resin for a flexible printed circuit board comprising a copper foil having coated thereon the thermoplastic polyhydroxy polyether resin according to claim 1.

10. A prepreg comprising a reinforcing material in the form of a sheet comprised of a fiber having coated thereon and/or immersed in the thermoplastic polyhydroxy polyether resin according to claim 1.

11. An electrolaminate and a flexible electrolaminate obtained from the thermoplastic polyhydroxy polyether resin according to claim 1.

12. An adhesive film comprising a support base film having formed thereon an insulating film made of the resin composition according to claim 5 and a thin film.

13. A copper foil with a resin for a printed circuit board and a copper foil with a resin for a flexible printed circuit board comprising a copper foil having coated thereon the resin composition according to claim 5.

14. A prepreg comprising a reinforcing material in the form of a sheet comprised of a fiber having coated thereon and/or immersed in the resin composition according to claim 5.

15. An electrolaminate and a flexible electrolaminate obtained from the resin composition according to claim 5.

16. An electrolaminate and a flexible electrolaminate obtained from the insulating film according to claim 8.

17. An electrolaminate and a flexible electrolaminate obtained from the copper foil with a resin for a printed circuit board according to claim 9.

18. An electrolaminate and a flexible electrolaminate obtained from the prepreg according to claim 10.

* * * * *